United States Patent
Lee et al.

(10) Patent No.: US 11,508,451 B2
(45) Date of Patent: Nov. 22, 2022

(54) STORAGE DEVICE THAT DETERMINES WRITE AREA OF READ RECLAIM OPERATION BASED ON ESTIMATED READ COUNT OF RECLAIM AREA AND OPERATING METHOD OF THE STORAGE DEVICE

(71) Applicant: SAMSUNG ELECTRONICS CO., LTD., Suwon-si (KR)

(72) Inventors: Kwangwoo Lee, Seoul (KR); Jinwoo Hong, Seoul (KR); Yunjung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 116 days.

(21) Appl. No.: 16/996,266

(22) Filed: Aug. 18, 2020

(65) Prior Publication Data
US 2021/0249094 A1    Aug. 12, 2021

(30) Foreign Application Priority Data

Feb. 6, 2020   (KR) .................. 10-2020-0014421

(51) Int. Cl.
*G11C 16/34*   (2006.01)
*G11C 16/08*   (2006.01)
(Continued)

(52) U.S. Cl.
CPC ...... *G11C 16/3495* (2013.01); *G06F 12/0246* (2013.01); *G06F 12/0891* (2013.01);
(Continued)

(58) Field of Classification Search
CPC ............ G11C 16/3418; G11C 16/3422; G11C 16/349; G11C 16/3495; G11C 16/26; G11C 16/0483
See application file for complete search history.

(56) References Cited

U.S. PATENT DOCUMENTS 7,679,133 B2   3/2010   Son et al.
8,553,466 B2   10/2013  Han et al.
(Continued)

FOREIGN PATENT DOCUMENTS

JP        4267682 B1    5/2009

OTHER PUBLICATIONS

Ha et al., A Read-Disturb Management Technique for High-Density NAND Flash Memory, Jul. 23-30, 2013, ACM Digital Library, p. 1 (Year: 2013).*

*Primary Examiner* — Alfredo Bermudez Lozada
(74) *Attorney, Agent, or Firm* — Volentine, Whitt & Francos, PLLC

(57) ABSTRACT

A storage device includes a nonvolatile memory device that includes a first storage area and a second storage area. A controller of the storage device controls the nonvolatile memory device and performs a read reclaim operation of reading data stored in the first storage area of the nonvolatile memory device and writing the read data in the second storage area. In the read reclaim operation, the controller is further configured to allow the nonvolatile memory device to perform sample read operations on the first storage area and to determine locations of the second storage area, at which the data are to be written, based on results of the sample read operations.

20 Claims, 16 Drawing Sheets

(51) Int. Cl.
　　　*G11C 16/16*　　　　(2006.01)
　　　*G06F 12/0891*　　(2016.01)
　　　*G11C 16/28*　　　　(2006.01)
　　　*G06N 20/00*　　　　(2019.01)
　　　*G06F 12/02*　　　　(2006.01)
　　　*G11C 16/30*　　　　(2006.01)
(52) U.S. Cl.
　　　CPC ............. *G06N 20/00* (2019.01); *G11C 16/08* (2013.01); *G11C 16/16* (2013.01); *G11C 16/28* (2013.01); *G11C 16/30* (2013.01); *G11C 16/3418* (2013.01)

(56) References Cited

U.S. PATENT DOCUMENTS

| | | |
|---|---|---|
| 8,559,235 B2 | 10/2013 | Yoon et al. |
| 8,654,587 B2 | 2/2014 | Yoon et al. |
| 9,176,800 B2 | 11/2015 | Blodgett |
| 9,361,182 B2 | 6/2016 | Hu et al. |
| 9,946,469 B2 | 4/2018 | Lin et al. |
| 10,216,422 B2 | 2/2019 | Kim et al. |
| 10,310,924 B2 | 6/2019 | Jei et al. |
| 2011/0233648 A1 | 9/2011 | Seol et al. |
| 2017/0371742 A1* | 12/2017 | Shim ..................... G11C 16/26 |
| 2018/0143762 A1* | 5/2018 | Kim ..................... G06F 3/0656 |
| 2018/0174658 A1 | 6/2018 | Kikuchi |
| 2018/0374541 A1* | 12/2018 | Jung ..................... G11C 16/10 |
| 2019/0220397 A1 | 7/2019 | Lee |
| 2020/0310688 A1* | 10/2020 | Byun ..................... G11C 16/26 |

* cited by examiner

STORAGE DEVICE THAT DETERMINES WRITE AREA OF READ RECLAIM OPERATION BASED ON ESTIMATED READ COUNT OF RECLAIM AREA AND OPERATING METHOD OF THE STORAGE DEVICE

CROSS-REFERENCE TO RELATED APPLICATIONS

This application claims priority under 35 U.S.C. § 119 to Korean Patent Application No. 10-2020-0014421 filed on Feb. 6, 2020, in the Korean Intellectual Property Office, the disclosure of which is incorporated by reference herein in its entirety.

BACKGROUND

Embodiments of the disclosure relate to a semiconductor device, and more particularly, relate to a storage device securing improved reliability when a read reclaim operation is performed and an operating method of the storage device.

A storage device refers to a device, which stores data under control of a host device, such as a computer, a smartphone, or a smart pad. The storage device includes a device, which stores data on a magnetic disk, such as a hard disk drive (HDD), or a device, which stores data in a semiconductor memory, in particular, a nonvolatile memory, such as a solid state drive (SSD) or a memory card.

A nonvolatile memory includes a read only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FeRAM), etc.

Degradation of data written in the nonvolatile memory progresses over time. For example, the reliability of data written in the nonvolatile memory may decrease over time. In the case where the reliability of data written in the nonvolatile memory decreases, a read reclaim operation of writing the data in any other storage space of the nonvolatile memory may be performed to prevent the loss of data.

SUMMARY

Embodiments of the disclosure provide a storage device securing improved reliability when a read reclaim operation is performed and an operating method of the storage device.

According to an exemplary embodiment, a storage device includes a nonvolatile memory device that includes a first storage area and a second storage area, and a controller that controls the nonvolatile memory device and performs a read reclaim operation of reading data stored in the first storage area of the nonvolatile memory device and writing the read data in the second storage area. In the read reclaim operation, the controller is further configured to allow the nonvolatile memory device to perform sample read operations on the first storage area and to determine locations of the second storage area, at which the data are to be written, based on results of the sample read operations.

According to an exemplary embodiment, an operating method of a storage device which includes a first storage area and a second storage area, each including two or more zones, includes performing two or more sample read operations on the first storage area to estimate read counts of the two or more zones of the first storage area, and performing a read reclaim operation of writing data of the first storage area in the second storage area. In the read reclaim operation, locations of the second storage area, at which data of each of the two or more zones of the first storage area are written, are adjusted based on the read counts.

According to an exemplary embodiment, a storage device includes a nonvolatile memory device that includes memory blocks, each of which includes cell strings, wherein each of the cell strings includes memory cells stacked on a substrate in a direction perpendicular to the substrate, and a controller. In a read reclaim operation in which data of a first memory block among the memory blocks are written in a second memory block, the controller performs sample read operations at the first memory block to estimate read counts of the data of the first memory block and determines locations of the second memory block, at which the data are to be written, depending on the read counts.

BRIEF DESCRIPTION OF THE FIGURES

The above and other objects and features of the disclosure will become apparent by describing in detail exemplary embodiments thereof with reference to the accompanying drawings.

DETAILED DESCRIPTION

Below, embodiments of the disclosure may be described in detail and clearly to such an extent that an ordinary one in the art easily implements the disclosure.

Figure 1:
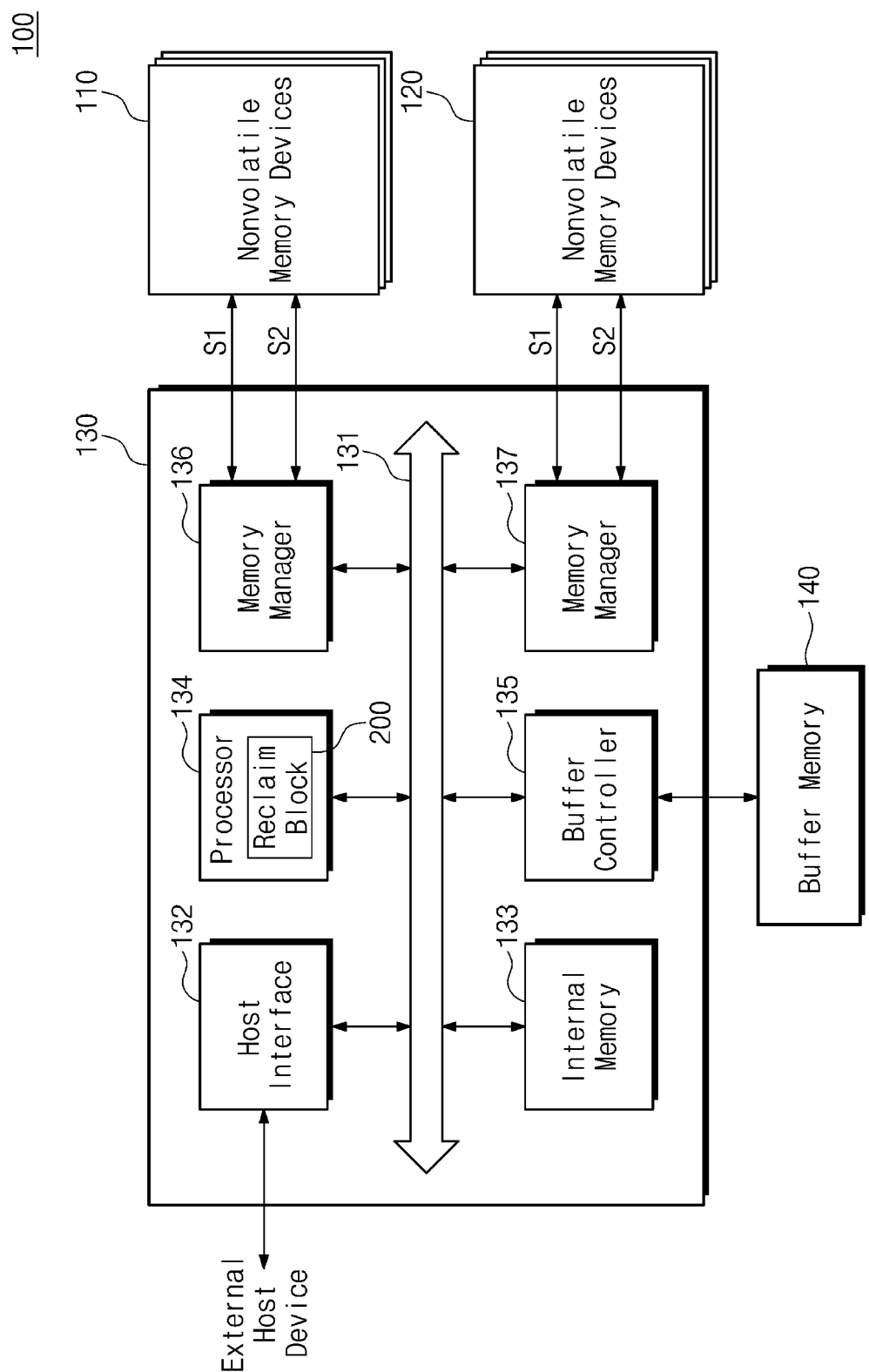
FIG. 1 illustrates a storage device according to an embodiment of the disclosure.

FIG. 1 illustrates a storage device 100 according to an embodiment of the disclosure. Referring to FIG. 1, the storage device 100 may include first nonvolatile memory devices 110, second nonvolatile memory devices 120, a controller 130, and a buffer memory 140.

The first nonvolatile memory devices 110 and the second nonvolatile memory devices 120 may include various nonvolatile memories such as a flash memory, a phase change memory, a ferroelectric memory, a magnetic memory, and a resistive memory. To convey the technical idea of the disclosure easily, it is assumed that the first nonvolatile memory devices 110 and the second nonvolatile memory devices 120 are flash memory devices, but the disclosure is not limited thereto.

The first nonvolatile memory devices 110 may communicate with the controller 130 through first signal lines S1 and second signal lines S2. The first signal lines S1 may transfer a command, an address, and data (e.g., in a time-division scheme). The second signal lines S2 may transfer control signals other than a command, an address, and data.

The second nonvolatile memory devices 120 may communicate with the controller 130 through first signal lines S1 and second signal lines S2. The first signal lines S1 may transfer a command, an address, and data (e.g., in a time-division scheme). The second signal lines S2 may transfer control signals other than a command, an address, and data.

The first signal lines S1 and the second signal lines S2 of the first nonvolatile memory devices 110 may form a first channel. The first signal lines S1 and the second signal lines S2 of the second nonvolatile memory devices 120 may form a second channel. The first channel and the second channel may be independent of each other. That is, under control of the controller 130, the first nonvolatile memory devices 110 and the second nonvolatile memory devices 120 may perform various operations, such as a write operation, a read operation, and an erase operation, independently of each other.

The controller 130 may control the first nonvolatile memory devices 110 and the second nonvolatile memory devices 120 depending on a request of an external host device or an internally designated schedule. The controller 130 may communicate with the external host device and with the first nonvolatile memory devices 110 and the second nonvolatile memory devices 120, by using the buffer memory 140.

The controller 130 may include an internal bus 131, a host interface 132, an internal memory 133, a processor 134, a buffer controller 135, a first memory manager 136, and a second memory manager 137.

The internal bus 131 may provide channels exchanging signals between components of the controller 130. The host interface 132 may receive requests each including a command and an address from the external host device and may transfer the received requests to the processor 134. The host interface 132 may store data received from the external host device in the buffer memory 140 through the internal bus 131 and the buffer controller 135. The host interface 132 may transfer data received from the buffer memory 140 through the buffer controller 135 and the internal bus 131 to the external host device.

The internal memory 133 may be a main memory of the controller 130. The processor 134 may load codes for driving firmware of the storage device 100 onto the internal memory 133. The processor 134 may load first meta information for managing the first nonvolatile memory devices 110 and the second nonvolatile memory devices 120 onto the internal memory 133. The internal memory 133 may include a dynamic random-access memory (DRAM) or a static random-access memory (SRAM).

The processor 134 may access the buffer memory 140 through the buffer controller 135. The processor 134 may perform buffering, that is, an operation of temporarily storing data exchanged between the external host device and the first nonvolatile memory devices 110 and the second nonvolatile memory devices 120 in the buffer memory 140.

The processor 134 may load second meta information including mapping information between first addresses (e.g., logical addresses) used in the external host device and second addresses (e.g., physical addresses) used in the first nonvolatile memory devices 110 and the second nonvolatile memory devices 120 onto the buffer memory 140 and may refer to the second meta information of the buffer memory 140. The buffer memory 140 may include a random access memory such as a DRAM, a PRAM, an MRAM, an RRAM, and an FeRAM.

The processor 134 may transfer commands for accessing the first nonvolatile memory devices 110, for example, write commands, read commands, and erase commands (and addresses associated therewith) to the first memory manager 136. The first memory manager 136 may access the first nonvolatile memory devices 110 in response to a command and an address.

In a write operation, the first memory manager 136 may receive data stored in the buffer memory 140 through the buffer controller 135 and the internal bus 131 and may transfer the received data to a nonvolatile memory device selected from the first nonvolatile memory devices 110. In a read operation, the first memory manager 136 may transfer data received from a nonvolatile memory device selected from the first nonvolatile memory devices 110 to the buffer memory 140 through the internal bus 131 and the buffer controller 135.

The second memory manager 137 may control the second nonvolatile memory devices 120 under control of the processor 134. The second memory manager 137 may control the second nonvolatile memory devices 120 in the same manner as the first memory manager 136 and independently of the first memory manager 136. Thus, additional description will be omitted to avoid redundancy.

The processor 134 may include a reclaim block 200. The reclaim block 200 may control a read reclaim operation. For example, when the total number of times of a read operation performed after data are written in a specific storage area among storage areas of the first nonvolatile memory devices 110 and the second nonvolatile memory devices 120 is a first threshold value or greater, a read reclaim operation of the specific storage area may be performed (or reserved).

When the number of read errors occurring in a specific storage area among the storage areas of the first nonvolatile memory devices 110 and the second nonvolatile memory devices 120 is a second threshold value or greater, the read reclaim operation of the specific storage area may be performed (or reserved).

When the number of read errors occurring in a specific storage area among the storage areas of the first nonvolatile memory devices 110 and the second nonvolatile memory devices 120 exceeds a correctable range and read errors are stored through a re-read operation in which a reinforced error recovery function is activated (or enabled), the read reclaim operation of the specific storage area may be performed (or reserved).

When an uncorrectable read error occurs in a specific storage area among the storage areas of the first nonvolatile memory devices 110 and the second nonvolatile memory devices 120, the read reclaim operation of the specific storage area may be performed (or reserved).

Read reclaim may include operations of moving (or copying) data of a first storage area to a second storage area. The reclaim block 200 may be configured to reinforce the reliability of data targeted for movement (or copy) when the read reclaim operation is performed in a specific storage area.

An example is illustrated in FIG. 1 as the first nonvolatile memory devices 110 and the second nonvolatile memory devices 120 communicate with the controller 130 through first channels and second channels. However, the storage device 100 may be changed or modified to include a single channel or to include two or more channels.

An example is illustrated in FIG. 1 as two or more nonvolatile memory devices are connected with one channel. However, the storage device 100 may be changed or modified in such a way that one nonvolatile memory device is connected with one channel.

An example is illustrated in FIG. 1 as the buffer memory 140 is present outside the controller 130. However, the buffer memory 140 may be omitted. Various functions that are described as being performed at the buffer memory 140 may be performed at the internal memory 133 instead of the buffer memory 140.

Figure 2:
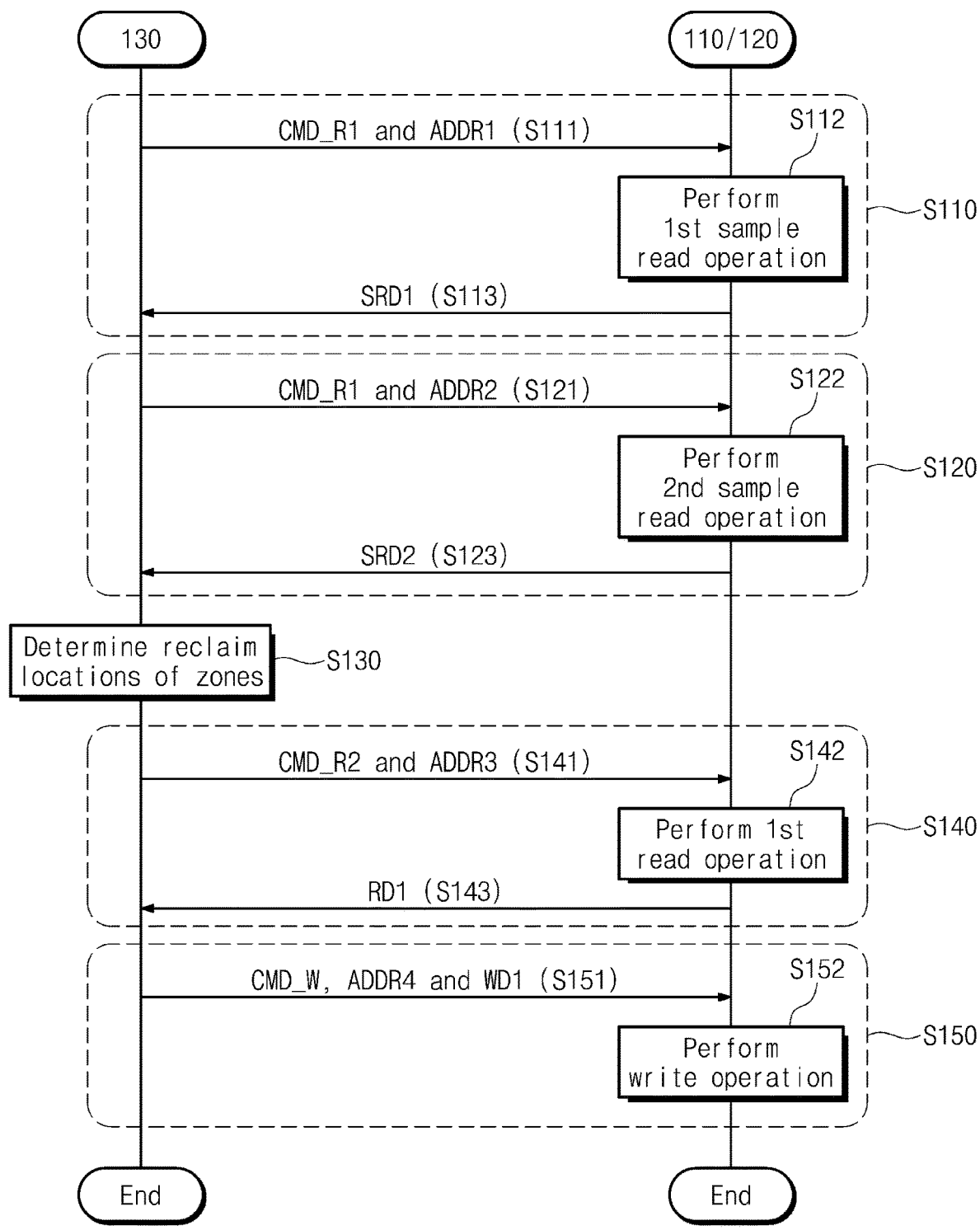
FIG. 2 illustrates an example where a read reclaim operation is performed at a storage device.

FIG. 2 illustrates an example where a read reclaim operation is performed at the storage device 100. The read reclaim operation of FIG. 2 may be performed by the reclaim block 200 of FIG. 1. An embodiment in which the read reclaim operation is performed at a nonvolatile memory device 110/120 selected from the first nonvolatile memory devices 110 and the second nonvolatile memory devices 120 of FIG. 1 is illustrated in FIG. 2.

Referring to FIGS. 1 and 2, in operation S110, the storage device 100 may perform a sample read operation. In detail, in operation S111, the controller 130 may transmit a first read command CMD_R1 and a first address ADDR1 to the nonvolatile memory device 110/120. In operation S112, the nonvolatile memory device 110/120 may perform a first sample read operation. In operation S113, the nonvolatile memory device 110/120 may transmit first sample read data SRD1, which is a result of the first sample read operation, to the controller 130.

In operation S120, the storage device 100 may perform the sample read operation. In detail, in operation S121, the controller 130 may transmit the read command CMD_R1 and a second address ADDR2 to the nonvolatile memory device 110/120. The second address ADDR2 may be different from the first address ADDR1. In operation S122, the nonvolatile memory device 110/120 may perform a second sample read operation. In operation S123, the nonvolatile memory device 110/120 may transmit second sample read data SRD2, which is a result of the second sample read operation, to the controller 130.

In operation S130, the reclaim block 200 of the controller 130 may determine reclaim locations of zones of a first storage area targeted for the read reclaim operation of the nonvolatile memory device 110/120, based on the first sample read data SRD1 and the second sample read data SRD2.

For example, the first storage area targeted for the read reclaim operation may be divided into two or more zones. A second storage area to which data of the first storage area are to be moved (or copied) may also be divided into two or more zones. The reclaim block 200 may determine whether to move (or copy) data stored in each of the zones of the first storage area to any zone of the zones of the second storage area. The reclaim block 200 may determine reclaim locations such that the reliability of data moved (or copied) to the zones of the second storage area through the read reclaim operation is improved.

In an embodiment, the sample read operation may be performed on each of the zones of the first storage area. The number of times that the sample read operation is performed may be equal to the number of zones of the first storage area (or the number of zones of the second storage area). The reclaim block 200 may detect features of data stored in the zones of the first storage area by performing the sample read operations on the zones of the first storage area, respectively. The reclaim block 200 may determine reclaim locations, based on the detected features.

In operation S140, the controller 130 may read data from the first storage area as a portion of the read reclaim operation. In detail, in operation S141, the controller 130 may transmit a second read command CMD_R2 and a third address ADDR3 to the nonvolatile memory device 110/120. The second read command CMD_R2 may be different from the first read command CMD_R1. The third address ADDR3 may be identical to or different from the first address ADDR1 or the second address ADDR2. The third address ADDR3 may belong to an address range of the first storage area. In operation S142, the nonvolatile memory device 110/120 may perform a first read operation. In operation S143, the nonvolatile memory device 110/120 may transmit first read data RD1, which is a result of the first read operation, to the controller 130.

In operation S150, the controller 130 may write data in the second storage area as a portion of the read reclaim operation. In detail, in operation S151, the controller 130 may transmit a write command CMD_W, a fourth address ADDR4, and first write data WD1 to the nonvolatile memory device 110/120. The fourth address ADDR4 may belong to an address range of the second storage area. The first write data WD1 may be identical to the first read data RD1. In operation S152, the nonvolatile memory device 110/120 may perform a write operation to write the first write data WD1 in the second storage area.

In an embodiment, the storage device 100 may move (or copy) data of the first storage area to the second storage area by repeatedly performing operation S140 and operation 150. Alternatively, the storage device 100 may move (or copy) data of the first storage area to the second storage area by repeatedly performing operation S140 and then repeatedly performing operation 150.

Data of the first storage area may be moved (or copied) to the second storage area in units of a data chunk. Data stored in the first storage area may be divided into two or more data chunks.

During an idle time when a request that is received from the external host device and is pending does not exist, the storage device 100 may move (or copy) one data chunk from the first storage area to the second storage area. Afterwards, the storage device 100 may check whether a request received from the external host device exists.

When a request received from the external host device exists, the storage device 100 may perform the request received from the external host device. When the storage device 100 is in an idle state in which no request from the external host device is pending, the storage device 100 may move (or copy) another data chunk from the first storage area to the second storage area.

A size of each data chunk may be equal to or different from a size of each zone. An operation of moving (or copying) each data chunk may be accomplished by performing operation S140 and operation S150 two times or more.

As described above, the reclaim block 200 may identify features of data stored in the first storage area for each zone (e.g., for each zone of the first storage area) by performing the sample read operations. The reclaim block 200 may determine whether to move (or copy) data stored in each of the zones of the first storage area to any zone of the zones of the second storage area, in consideration of the features of data. The reclaim block 200 may determine reclaim locations such that the reliability of data to be reclaimed is improved.

Figure 3:
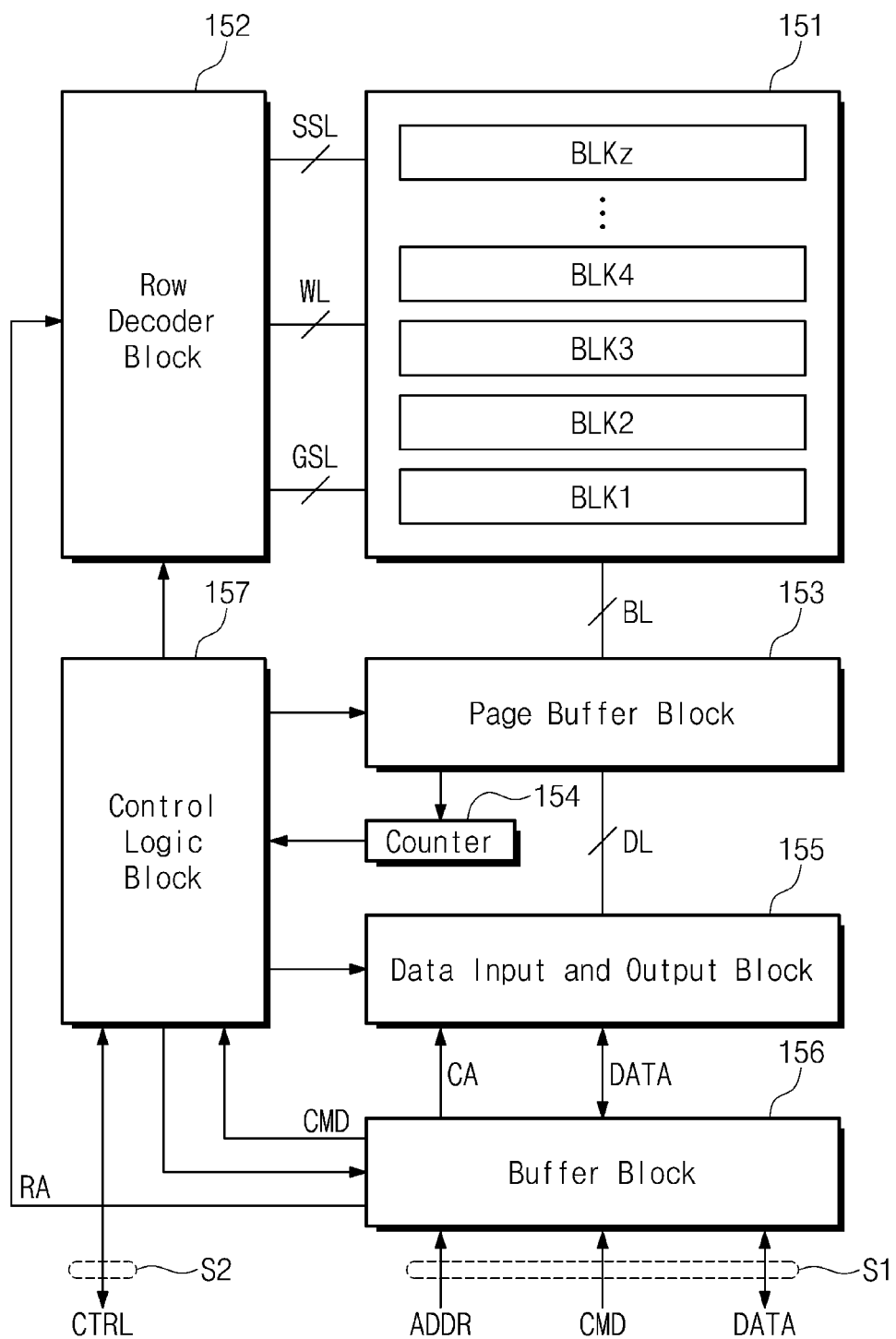
FIG. 3 is a block diagram illustrating a nonvolatile memory device according to an embodiment of the disclosure.

FIG. 3 is a block diagram illustrating a nonvolatile memory device 110/120 according to an embodiment of the disclosure. Referring to FIG. 3, the nonvolatile memory device 110/120 includes a memory cell array 151, a row decoder block 152, a page buffer block 153, a counter 154, a data input and output block 155, a buffer block 156, and a control logic block 157.

The memory cell array 151 includes a plurality of memory blocks BLK1 to BLKz. Each of the memory blocks BLK1 to BLKz may include a plurality of memory cells. Each of the memory blocks BLK1 to BLKz may be connected with the row decoder block 152 through one or more ground selection lines GSL, word lines WL, and one or more string selection lines SSL. Some of the word lines WL may be used as dummy word lines. Each of the memory blocks BLK1 to BLKz may be connected with the page buffer block 153 through a plurality of bit lines BL. The plurality of memory blocks BLK1 to BLKz may be connected in common with the plurality of bit lines BL.

In an embodiment, each of the plurality of memory blocks BLK1 to BLKz may be a unit of an erase operation. The memory cells belonging to each of the memory blocks BLK1 to BLKz may be erased at the same time. For another example, each of the plurality of memory blocks BLK1 to BLKz may be divided into a plurality of sub-blocks. Each of the plurality of sub-blocks may correspond to a unit of an erase operation.

The row decoder block 152 is connected with the memory cell array 151 through the ground selection lines GSL, the word lines WL, and the string selection lines SSL. The row decoder block 152 operates under control of the control logic block 157.

The row decoder block 152 may decode a row address RA received from the buffer block 156 and may control voltages to be applied to the string selection lines SSL, the word lines WL, and the ground selection lines GSL based on a result of decoding the row address RA.

The page buffer block 153 is connected with the memory cell array 151 through the plurality of bit lines BL. The page buffer block 153 is connected with the data input and output block 155 through a plurality of data lines DL. The page buffer block 153 operates under control of the control logic block 157.

In a write operation, the page buffer block 153 may store data to be written in memory cells. The page buffer block 153 may apply voltages to the plurality of bit lines BL based on the stored data. In a read operation or in a verify read operation that is performed in the write operation or an erase operation, the page buffer block 153 may sense voltages of the bit lines BL and may store the sensing result.

The counter 154 may count bits stored in the page buffer block 153. For example, the counter 154 may count the number of 1s or 0s among the bits stored in the page buffer block 153. For example, the counter 154 may perform counting in a verify read operation associated with a write operation or an erase operation. The counter 154 may provide a count value to the control logic block 157.

The data input and output block 155 is connected with the page buffer block 153 through the plurality of data lines DL. The data input and output block 155 may receive a column address CA from the buffer block 156. The data input and output block 155 may output data read by the page buffer block 153 to the buffer block 156 depending on the column address CA. The data input and output block 155 may provide data received from the buffer block 156 to the page buffer block 153, based on the column address CA.

The buffer block 156 may receive a command CMD and an address ADDR from an external device through the first signal lines S1 and may exchange data "DATA" with the external device through the first signal lines S1. The buffer block 156 may operate under control of the control logic block 157. The buffer block 156 may provide the command CMD to the control logic block 157. The buffer block 156 may provide the row address RA of the address ADDR to the row decoder block 152 and may provide the column address CA of the address ADDR to the data input and output block 155. The buffer block 156 may exchange the data "DATA" with the data input and output block 155.

The control logic block 157 may exchange control signals CTRL with the external device through the second signal lines S2. The control logic block 157 may allow the buffer block 156 to route the command CMD, the address ADDR, and the data "DATA". The control logic block 157 may decode the command CMD received from the buffer block 156 and may control the nonvolatile memory device 110/120 based on the decoded command.

In an embodiment, the nonvolatile memory device 110/120 may be manufactured in a bonding manner. The memory cell array 151 may be manufactured at a first wafer, and the row decoder block 152, the page buffer block 153, the data input and output block 155, the buffer block 156, and the control logic block 157 may be manufactured at a second wafer. The nonvolatile memory device 110/120 may be implemented by coupling the first wafer and the second wafer such that an upper surface of the first wafer and an upper surface of the second wafer face each other.

For another example, the nonvolatile memory device 110/120 may be manufactured in a cell over peri (COP) manner. The peripheral circuit including the row decoder block 152, the page buffer block 153, the data input and output block 155, the buffer block 156, and the control logic block 157 may be implemented on a substrate. The memory cell array 151 may be implemented over the peripheral circuit. The peripheral circuit and the memory cell array 151 may be connected by using through vias.

Figure 4:
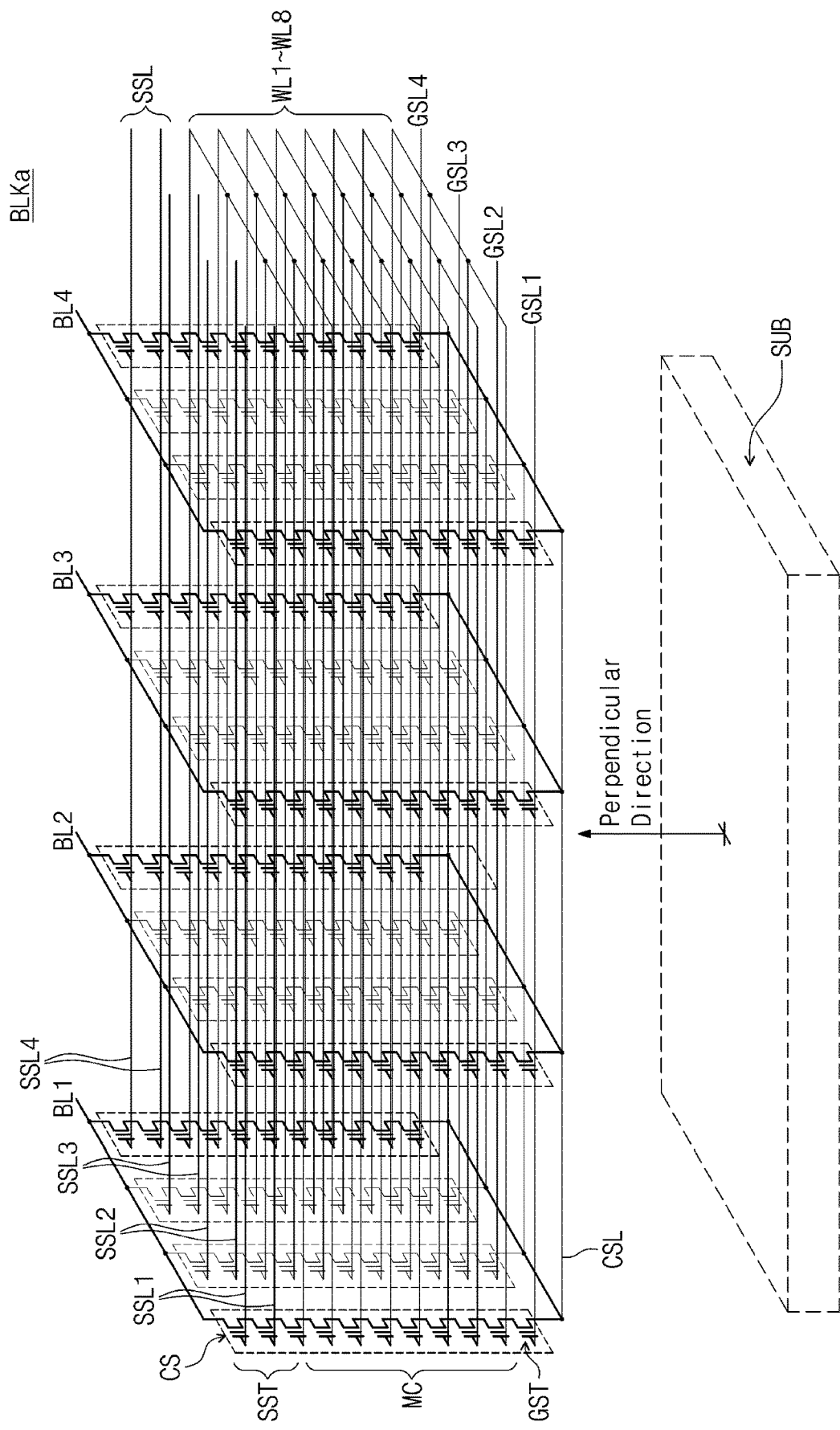
FIG. 4 is a circuit diagram illustrating an example of one memory block of memory blocks of FIG. 3.

FIG. 4 is a circuit diagram of an example of one memory block BLKa of the memory blocks BLK1 to BLKz of FIG. 3. Referring to FIG. 4, a plurality of cell strings CS may be arranged on a substrate SUB in rows and columns. The plurality of cell strings CS may be connected in common with a common source line CSL that is formed on (or in) the substrate SUB. In FIG. 4, a location of the substrate SUB is exemplified to help understand a structure of the memory block BLKa.

An example is illustrated in FIG. 4 as the common source line CSL is connected to lower ends of the cell strings CS. However, it is sufficient if the common source line CSL is electrically connected to the lower ends of the cell strings CS, and the disclosure is not limited to the case that the common source line CSL is physically located at the lower ends of the cell strings CS. An example is illustrated in FIG. 4 in which the cell strings CS are arranged in a 4×4 matrix; but, the number of cell strings CS in the memory block BLKa may increase or decrease.

The cell strings CS of each row may be connected in common with a corresponding ground selection line GSL among GSL1 to GSL4 and with a corresponding string selection line SSL of first to fourth string selection lines SSL1 to SSL4. Cell strings of each column may be connected with a corresponding one of first to fourth bit lines BL1 to BL4. To prevent a drawing from being complicated, the cell strings CS connected with the second and third string selection lines SSL2 and SSL3 are depicted to be blurred.

Each of the cell strings CS may include at least one ground selection transistor GST connected to the corresponding ground selection line GSL1 to GSL4, a plurality of memory cells MC (e.g., MC1 to MC8) respectively connected with a plurality of word lines WL1 to WL8, and string selection transistors SST respectively connected with the string selection lines SSL1, SSL2, SSL3, or SSL4.

In each of the cell strings CS, the ground selection transistor GST, the memory cells MC, and the string selection transistors SST may be connected in series along a direction perpendicular to the substrate SUB and may be sequentially stacked along the direction perpendicular to the substrate SUB. In each of the cell strings CS, at least one of the memory cells MC (e.g., MC1 to MC8) may be used as a dummy memory cell. The dummy memory cell may not be programmed (e.g., may be program-inhibited) or may be programmed differently from the remaining memory cells other than the dummy memory cell from among the memory cells MC (e.g., MC1 to MC8).

In an embodiment, memory cells that are positioned at the same height and are associated with one string selection line SSL1, SSL2, SSL3, or SSL4 may form one physical page. Memory cells of one physical page may be connected to one sub-word line. Sub-word lines of physical pages positioned at the same height may be connected in common to one word line.

In an embodiment, sub-word lines of physical pages positioned at the same height may be connected to each other at a height at which the sub-word lines are formed. For another example, sub-word lines of physical pages positioned at the same height may be indirectly connected to each other in any other layer, which has a height different from a height at which the sub-word lines are formed, such as a metal layer.

Figure 5:
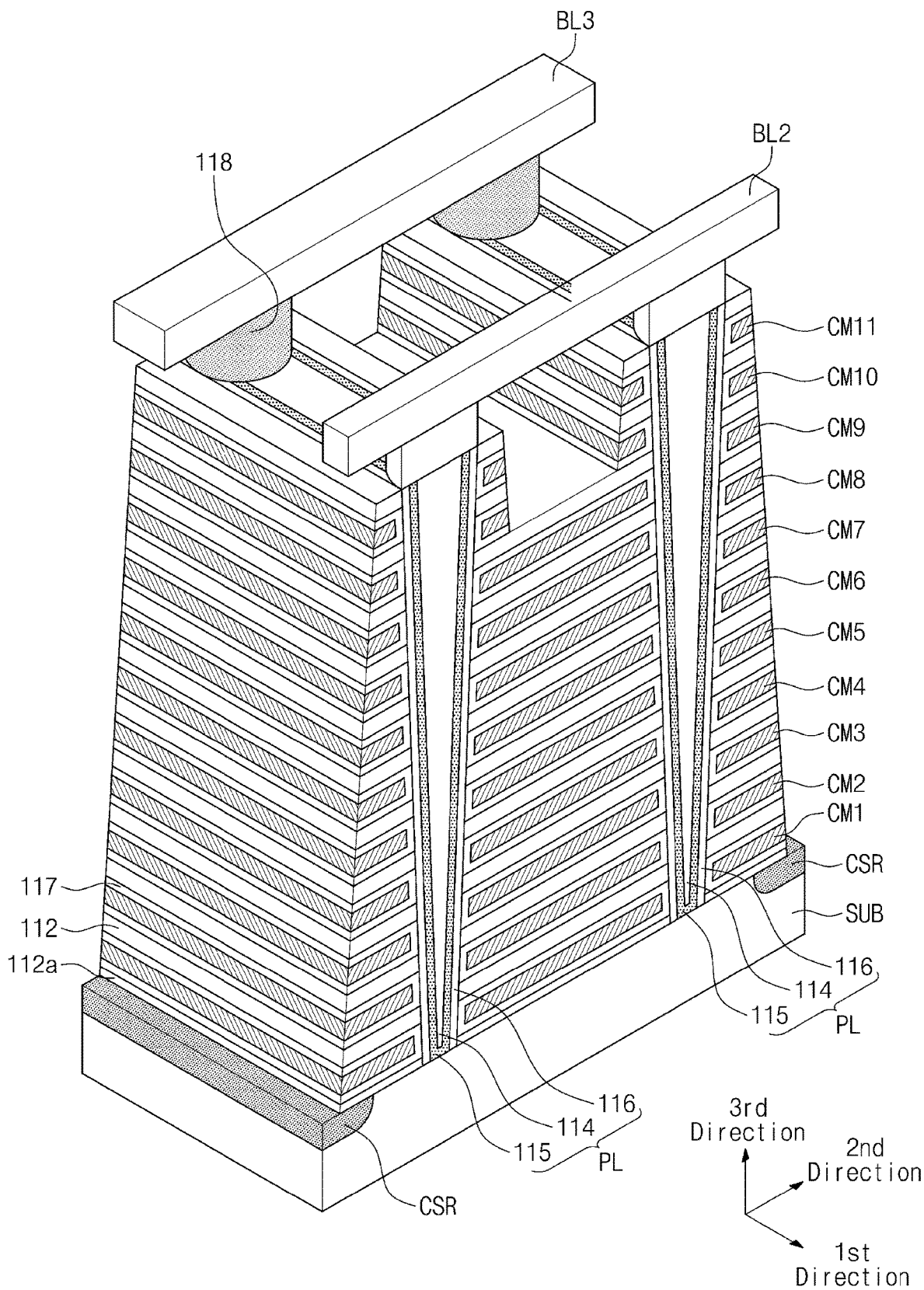
FIG. 5 is a perspective view illustrating a partial structure of a memory block of FIG. 4.

FIG. 5 is a perspective view of a partial structure of the memory block BLKa of FIG. 4. Referring to FIGS. 4 and 5, common source regions CSR that extend along a first direction and are spaced from each other along a second direction are provided on the substrate SUB.

The common source regions CSR may be connected in common to form a common source line CSL. In an embodiment, the substrate SUB may include a P-type semiconductor material. The common source regions CSR may include an N-type semiconductor material. For example, a conductive material for increasing conductivity of the common source line CSL may be disposed on the common source region CSR.

Between the common source regions CSR, insulating layers 112 and 112a are sequentially stacked on the substrate SUB along a third direction perpendicular to the substrate SUB. The insulating layers 112 and 112a may be stacked to be spaced from each other along the third direction. In an embodiment, the insulating layers 112 and 112a may include silicon oxide or silicon nitride. In an embodiment, the thicknesses (e.g., a thicknesses of the third direction) of the insulating layer 112a, which is in contact with the substrate SUB, from among the insulating layers 112 and 112a may be thinner than the thickness (e.g., a thickness of the third direction) of each of the remaining insulating layers 112.

Pillars PL that are disposed to be spaced from each other along the first direction and the second direction and penetrate the insulating layers 112 and 112a along the third direction are provided between the common source regions CSR. In an embodiment, the pillars PL may be in contact with the substrate SUB through the insulating layers 112 and 112a. Each of the pillars PL may include an inner material 114, a channel layer 115, and a first insulating layer 116.

The inner material 114 may include an insulating material or an air gap. The channel layer 115 may include a P-type semiconductor material or an intrinsic semiconductor material. The first insulating layer 116 may include one or more of insulating layers (e.g., different insulating layers) such as a silicon oxide layer, a silicon nitride layer, and an aluminum oxide layer.

Between the common source regions CSR, second insulating layers 117 are provided on upper surfaces and lower surfaces of the insulating layers 112 and 112a and exposed outer surfaces of the pillars PL. There may be removed the second insulating layers 117 provided on an upper surface of the uppermost insulating layer among the insulating layers 112 and 112a.

In each of the pillars PL, portions, which are adjacent to each other, of the first insulating layer 116 and the second insulating layer 117 may be coupled to form an information storage layer. For example, the first insulating layer 116 and the second insulating layer 117 may include oxide-nitride-oxide (ONO) or oxide-nitride-aluminum (ONA). The first insulating layer 116 and the second insulating layer 117 may form a tunneling insulating layer, a charge trap layer, and a blocking insulating layer.

Between the common source regions CSR and between the insulating layers 112 and 112a, conductive materials CM1 to CM11 are provided on exposed outer surfaces of the second insulating layers 117. The conductive materials CM1 to CM11 may include a metallic conductive material. Drains 118 are provided on the pillars PL. In an embodiment, the drains 118 may include an N-type semiconductor material (e.g., silicon). In an embodiment, the drains 118 may be in contact with upper surfaces of the channel layers of the pillars PL.

The bit lines BL2 and BL3 that extend along the second direction and are spaced from each other along the first direction are provided on the drains 118. The bit lines BL2 and BL3 are connected with the drains 118. In an embodiment, the drains 118 and bit lines (e.g., BL2 and BL3) may be connected through contact plugs. The bit lines BL2 and BL3 may include a metallic conductive material.

The pillars PL form the cell strings CS together with the first and second insulating layers 116 and 117 and the conductive materials CM1 to CM11. Each of the pillars PL forms a cell string together with the first and second insulating layers 116 and 117 and the conductive materials CM1 to CM11, which are adjacent thereto. The first conductive material CM1 may form the ground selection transistors GST together with the first and second insulating layers 116 and 117 and the channel layers 115 adjacent thereto. The first conductive material CM1 may extend along the first direction to form the ground selection line GSL.

The second to ninth conductive materials CM2 to CM9 may form first to eighth memory cells MC1 to MC8 (see FIG. 6) together with the first and second insulating layers 116 and 117 and the channel layers 115, which are adjacent thereto. The second to ninth conductive materials CM2 to CM9 may extend along the first direction to form first to eighth word lines WL1 to WL8, respectively.

The tenth conductive materials CM10 may form lower string selection transistors, which are adjacent to the substrate SUB, from among the string selection transistors SST together with the first and second insulating layers 116 and 117 and the channel layers 115 adjacent thereto. The tenth conductive materials CM10 may extend along the first direction to form lower string selection lines, which are close to the substrate SUB, from among the string selection lines SSL1 to SSL4.

The eleventh conductive materials CM11 may form the string selection transistors, which are adjacent to the bit lines BL1 to BL4, from among the string selection transistors SST together with the first and second insulating layers 116 and 117 and the channel layers 115, which are adjacent thereto. The eleventh conductive materials CM11 may extend along the first direction to form the upper string selection lines, which are close to the bit lines BL1 to BL4, from among the string selection lines SSL1 to SSL4.

The memory block BLKa may be provided at a three-dimensional (3D) memory array. The 3D memory array is monolithically formed in one or more physical levels of arrays of memory cells MC (e.g., MC1 to MC8) having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

An embodiment is illustrated in FIG. 5 as the common source region CSR is provided as a portion of the substrate SUB, but the common source region CSR may be provided in the form of a plate covering the substrate SUB.

In an embodiment, a first storage area targeted for the read reclaim operation may be one memory block. A second storage area to which data are to be moved (or copied) by the read reclaim operation may be another memory block.

Figure 6:
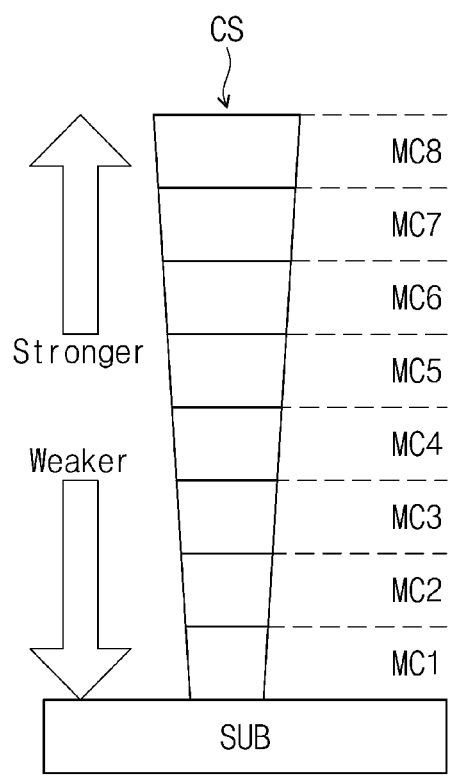
FIG. 6 illustrates one of cell strings of FIGS. 4 and 5.

FIG. 6 illustrates one of the cell strings CS of FIGS. 4 and 5. Referring to FIGS. 1 and 4 to 6, sizes of the memory cells MC (e.g., MC1 to MC8) may vary depending on a distance from the substrate SUB. For example, in the example illustrated in FIGS. 5 and 6, as a distance from the substrate SUB increases, sizes of the memory cells MC1 to MC8 may increase.

As the sizes of the memory cells MC1 to MC8 increase, a speed at which the memory cells MC1 to MC8 are programmed may become slower. As the sizes of the memory cells MC1 to MC8 decrease, a speed at which the memory cells MC1 to MC8 are programmed may become higher.

After data are written in the memory cells MC1 to MC8, the degradation of the data may progress (or the reliability of the data may decrease) due to various factors. For example, due to a characteristic called "retention," threshold voltages of the memory cells MC1 to MC8 may decrease over time. Alternatively, as a high voltage is applied to word lines in a read operation or a write operation, a disturbance may occur due to increasing threshold voltages of the memory cells MC1 to MC8.

Threshold voltages of memory cells of a high program speed may vary quickly, and thus, the robustness to maintain a threshold voltage even though factors such as retention and disturbance occur may be relatively weak. Threshold voltages of memory cells of a low program speed may vary slowly, and thus, the robustness to maintain a threshold voltage even though factors such as retention and disturbance occur may be relatively strong.

The reclaim block 200 may estimate read frequencies of data of respective zones of a first storage area through the sample read operations. The reclaim block 200 may store hot data of a specific zone, of which a read frequency is higher than those of the remaining zones of the first storage area, in a robustness-strong portion (e.g., MC5 to MC8) of a second storage area. The reclaim block 200 may store cold data of a specific zone, of which a read frequency is lower than those of the remaining zones of the first storage area, in a robustness-weak portion (e.g., MC1 to MC4) of the second storage area.

The reliability of reclaimed data may be improved by performing the read reclaim operation in consideration of read frequencies of data of the zones of the first storage area targeted for the read reclaim operation and the robustness of the respective zones of the second storage area, to which data are to be moved (or copied).

Figure 7:
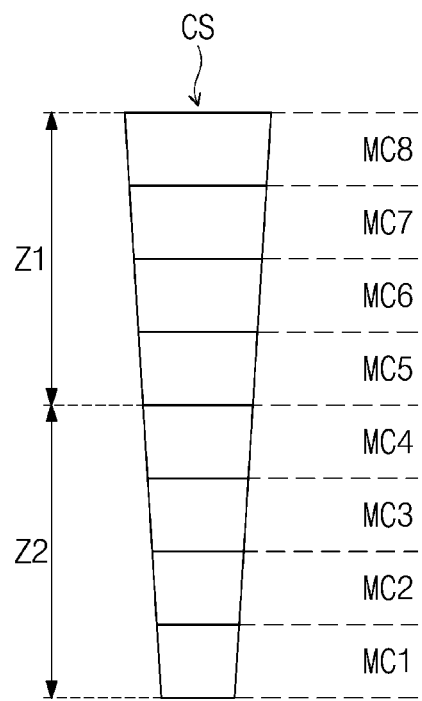
FIG. 7 illustrates an example in which a reclaim block divides a first storage area into a first zone and a second zone.

FIG. 7 illustrates an example in which the reclaim block 200 divides a first storage area into a first zone Z1 and a second zone Z2. Referring to FIGS. 1, 4, 5, and 7, the fifth to eighth memory cells MC5 to MC8 may belong to the first zone Z1, and the first to fourth memory cells MC1 to MC4 may belong to the second zone Z2.

The reclaim block 200 may select a sample memory cell from the fifth to eighth memory cells MC5 to MC8 belonging to the first zone Z1 (or sample memory cells of one physical page connected with one word line) and may perform the sample read operation on the sample memory cell(s).

For example, the reclaim block 200 may select the fifth memory cell(s) MC5 having the weakest robustness (or having the smallest size) as the sample memory cell(s). The reclaim block 200 may use a read count identified through the sample read operation as a read count of all data stored in the first zone Z1.

Also, the reclaim block 200 may select a sample memory cell from the first to fourth memory cells MC1 to MC4 belonging to the second zone Z2 (or sample memory cells of one physical page connected with one word line) and may perform the sample read operation on the sample memory cell(s).

For example, the reclaim block 200 may select the first memory cell(s) MC1 having the weakest robustness (or having the smallest size) as the sample memory cell(s). The reclaim block 200 may use a read count identified through the sample read operation as a read count of all data stored in the second zone Z2.

In an embodiment, the controller 130 may perform the sample read operation of the first zone Z1 and the sample read operation of the second zone Z2 at a time interval. The controller 130 may perform the sample read operation on one of the first zone Z1 and the second zone Z2 in an idle state. Afterwards, the controller 130 may perform a request of the external host device. When an additional idle time occurs, the controller 130 may perform the sample read operation on the other of the first zone Z1 and the second zone Z2.

Figure 8:
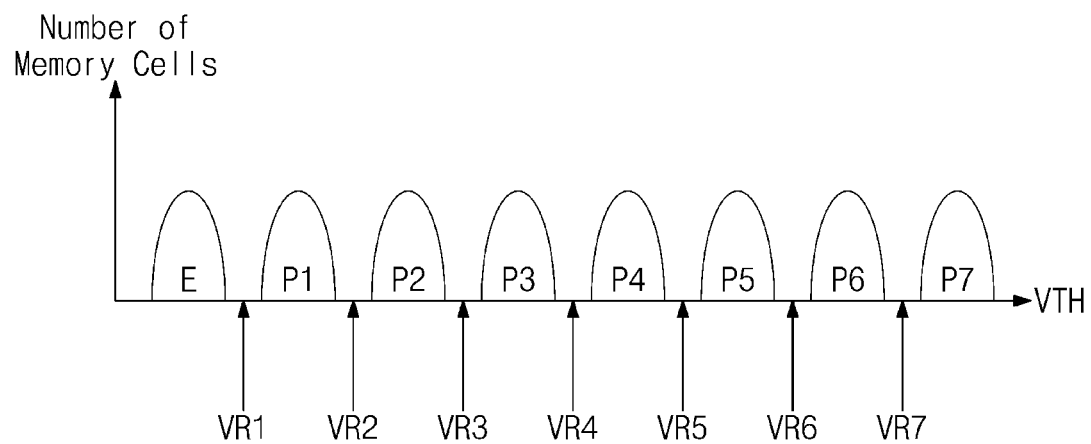
FIG. 8 illustrates an example of read voltages used when a read operation is performed based on a second read command of FIG. 2.

FIG. 8 illustrates an example of read voltages used when a read operation is performed based on the second read command CMD_R2 of FIG. 2. In FIG. 8, a horizontal axis represents a threshold voltage VTH of a memory cell, and a vertical axis represents the number of memory cells.

Referring to FIGS. 1, 4, and 8, each of the memory cells MC1 to MC8 may store "n" bits (n being a positive integer). When "n" bits are stored in each of the memory cells MC1 to MC8, the memory cells MC1 to MC8 in which data are written may have states that are expressed by different $2^n$ threshold voltage ranges.

In an embodiment, it is assumed that "n" is "3". Each of the memory cells MC1 to MC8 may have one of an erase state "E" and first to seventh program states P1 to P7. In a read operation, first to seventh read voltages VR1 to VR7 corresponding to voltage levels between the states or a part thereof may be used.

Figure 9:
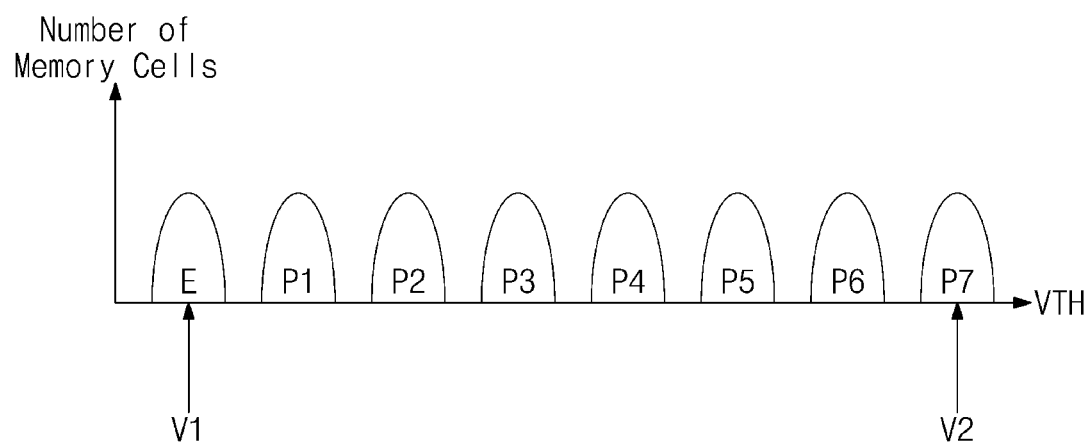
FIG. 9 illustrates an example of sample read voltages used when a sample read operation is performed based on a first read command of FIG. 2.

FIG. 9 illustrates an example of sample read voltages used when a sample read operation is performed based on the first read command CMD_R1 of FIG. 2. In FIG. 9, a horizontal axis represents a threshold voltage VTH of a memory cell, and a vertical axis represents the number of memory cells.

Referring to FIGS. 1, 4, and 9, sample read voltages may include a first voltage V1 and a second voltage V2. The first voltage V1 may belong to a threshold voltage range of the erase state "E". The first voltage V1 may be used to test the influence of disturbance. The second voltage V2 may belong to a threshold voltage range of the seventh program state P7 being the highest. The second voltage V2 may be used to test the influence of retention.

In an embodiment, the controller 130 may separately transmit the first read command CMD_R1 directing the sample read operation using the first voltage V1 and the first read command CMD_R1 directing the sample read operation using the second voltage V2 to the nonvolatile memory device 110/120. That is, with regard to each zone, the first read command CMD_R1 may be transmitted two times, and the sample read operation may be performed two times.

For another example, the controller 130 may transmit the first read command CMD_R1 directing the sample read operation using the first voltage V1 and the second voltage V2 to the nonvolatile memory device 110/120. That is, with regard to each zone, the first read command CMD_R1 may be transmitted once, and the sample read operation may be performed two times.

When the sample read operation is performed by using the first voltage V1, the nonvolatile memory device 110/120 may output, to the controller 130, the read data or a count value, which is obtained by counting the number of logical values (e.g., "0") indicating on-cells from among logical values of the read data, as sample read data or a portion of the sample read data or may store the read data or the count value. On-cells are memory cells that are turned on in response to the first voltage V1 and have threshold voltages smaller than the first voltage V1.

When the sample read operation is performed by using the second voltage V2, the nonvolatile memory device 110/120 may output or store, to the controller 130, the read data or a count value, which is obtained by counting the number of logical values (e.g., "1") indicating off-cells from among logical values of the read data, as sample read data or a portion of the sample read data or may store the read data or the count value. Off-cells are memory cells that are turned off in response to the second voltage V2 and have threshold voltages greater than the second voltage V2. The nonvolatile memory device 110/120 may transmit the stored data or count value to the controller 130.

Figure 10:
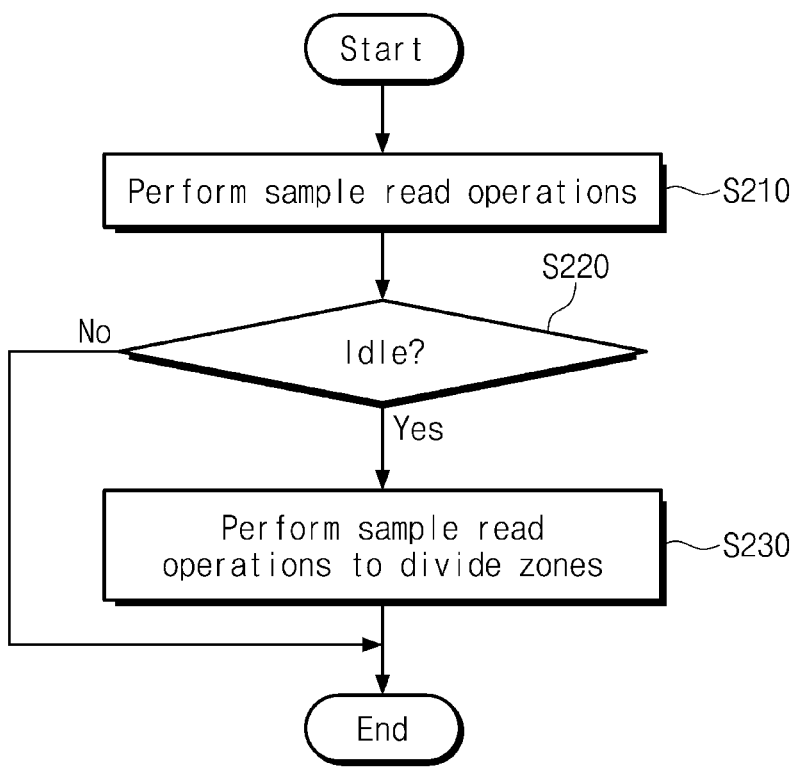
FIG. 10 illustrates an example in which a storage device adaptively performs sample read operations.

FIG. 10 illustrates an example in which the storage device 100 adaptively performs sample read operations. Referring to FIGS. 1 and 10, in operation S210, the controller 130 may perform sample read operations. For example, the controller 130 may perform the sample read operations in an idle state. The controller 130 may perform the sample read operations on zones, the number of which corresponds to a default value. For example, the number of zones, which corresponds to the default value, may be "2" as described with reference to FIG. 7.

In operation S220, the controller 130 may determine whether the idle state is maintained. When it is determined that the idle state is not maintained (or when the storage device 100 exits from the idle state), the controller 130 may terminate the sample read operations. That is, the controller 130 may use only results of the sample read operations performed on the zones, the number of which corresponds to the default value.

When it is determined that the idle state is maintained, in operation S230, the controller 130 may perform additional sample read operations to additionally subdivide zones. That is, in the case where the idle state is maintained, the number of zones may increase.

Figure 11:
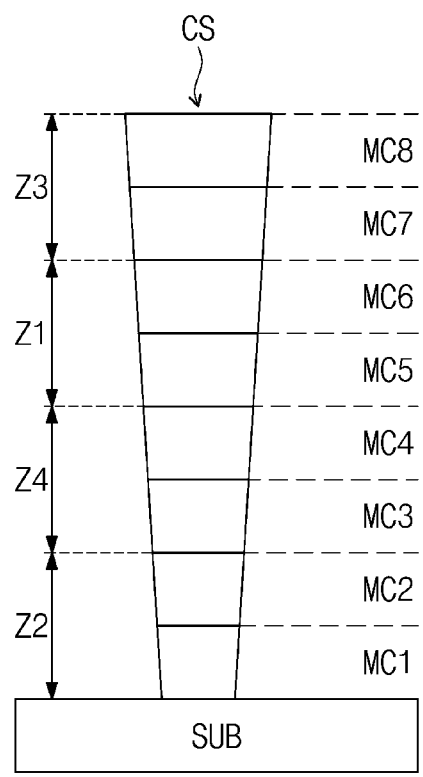
FIG. 11 illustrates an example in which zones of a cell string of FIG. 7 are divided through additional sample read operations.

FIG. 11 illustrates an example in which zones of the cell string CS of FIG. 7 are divided through additional sample read operations. Referring to FIGS. 1, 10, and 11, the controller 130 may divide the fifth to eighth memory cells MC5 to MC8 identified as belonging to the first zone Z1 in FIG. 7 into the fifth and sixth memory cells MC5 and MC6 belonging to the first zone Z1 and the seventh and eighth memory cells MC7 and MC8 belonging to a third zone Z3.

A result of performing the sample read operation on the fifth memory cells MC5 may be used to estimate a read count of data stored in the first zone Z1. The controller 130 may perform an additional sample read operation on the seventh memory cells MC7 and may use a result of the sample read operation to estimate a read count of data stored in the third zone Z3.

The controller 130 may divide the first to fourth memory cells MC1 to MC4 identified as belonging to the second zone Z2 in FIG. 7 into the first and second memory cells MC1 and MC2 belonging to the second zone Z2 and the third and fourth memory cells MC3 and MC4 belonging to a fourth zone Z4.

A result of performing the sample read operation on the first memory cells MC1 may be used to estimate a read count of data stored in the second zone Z2. The controller 130 may perform an additional sample read operation on the third memory cells MC3 and may use a result of the sample read operation to estimate a read count of data stored in the fourth zone Z4.

As zones are subdivided, read counts of data may be estimated more finely, and the reliability of data may be further improved after the read reclaim operation. In an embodiment, after the additional sample read operations are performed, in the case where the idle state is maintained, the controller 130 may further perform additional sample read operations.

Figure 12:
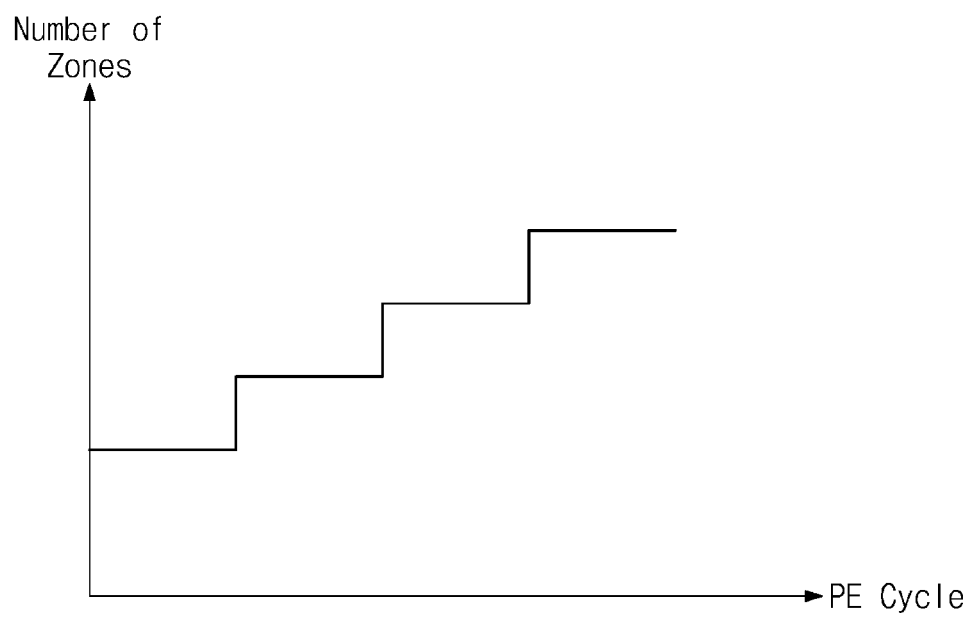
FIG. 12 illustrates another example in which a storage device adaptively performs sample read operations.

FIG. 12 illustrates another example in which the storage device 100 adaptively performs sample read operations. In FIG. 12, a horizontal axis represents the number of times (i.e., the number of Program/Erase (PE) cycles) that program and erase operations are performed at a first storage area (e.g., a memory block) targeted for the read reclaim operation. A vertical axis represents the number of zones.

Referring to FIGS. 1 and 12, as the number of PE cycles increases, the controller 130 may increase the number of zones. As memory cells are repeatedly programmed and erased, the degrees of degradation of the memory cells may be different. Memory cells having the different degrees of degradation may have an influence of retention and disturbance of different levels.

Accordingly, read counts of data may be estimated more finely by increasing the number of zones and the number of sample read operations as the number of PE cycles increases. In an embodiment, the number of zones in FIG. 12 may correspond to the default value indicating the number of zones described with reference to FIG. 10.

Figure 13:
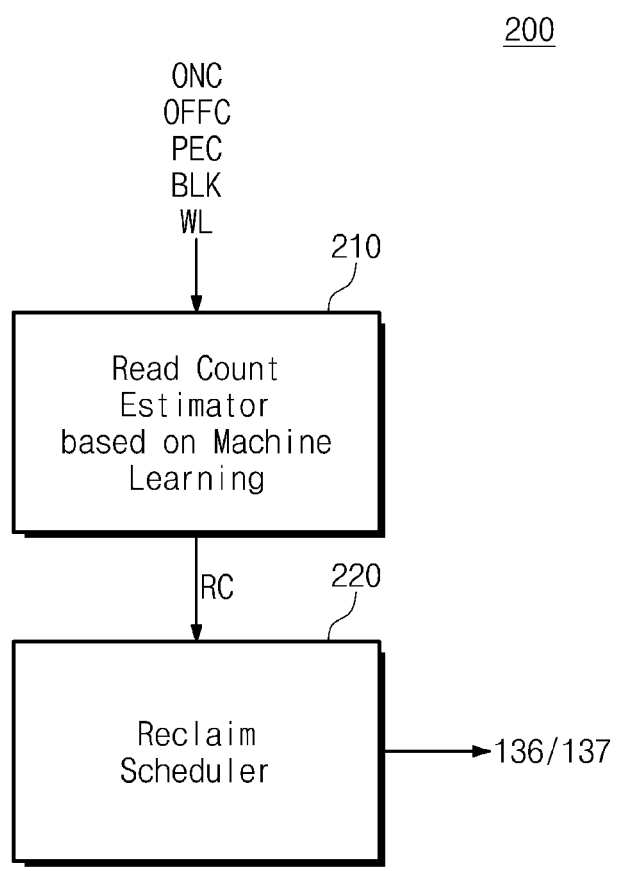
FIG. 13 illustrates an example of a reclaim block.

FIG. 13 illustrates an example of the reclaim block 200. Referring to FIGS. 1, 9, and 13, the reclaim block 200 may include a read count estimator 210 based on machine learning and a reclaim scheduler 220.

The read count estimator 210 may receive an on-cell count ONC corresponding to the first voltage V1, an off-cell count OFFC corresponding to the second voltage V2, a program/erase count PEC of a memory block targeted for the read reclaim operation, information BLK of the memory block targeted for the read reclaim operation, and information WL of word lines where the sample read operations are performed.

The read count estimator 210 may estimate a read count RC from the received information ONC, OFFC, PEC, BLK, and WL, based on the machine learning. For example, the read count estimator 210 may include an algorithm that performs write operations, read operations, and erase operations at storage devices in various patterns under various environments and learns changes in threshold voltages of memory cells based on the machine learning.

As the read count estimator 210 performs learning and estimation based on the program/erase count PEC, the read count estimator 210 may consider a difference between tendencies of changes in threshold voltages according to the degradation of memory cells. As the read count estimator 210 performs learning and estimation based on the information BLK of memory blocks, the read count estimator 210 may consider a difference between tendencies of changes in threshold voltages according to the locations of the memory blocks. As the read count estimator 210 performs learning and estimation based on the information WL of word lines, the read count estimator 210 may consider a difference between tendencies of changes in threshold voltages according to the robustness The reclaim scheduler 220 may schedule read operations and write operations for the read reclaim operation based on the read count RC, with regard to the first memory manager 136 or the second memory manager 137.

In an embodiment, the storage device 100 may be configured to perform write operations in order from memory cells distant from the substrate SUB (refer to FIGS. 4 and 5) to memory cells close to the substrate SUB. The reclaim scheduler 220 may be configured to first reclaim (i.e., read and write) data of a zone having a great read count and to then reclaim data of a zone having a small read count.

For another example, the storage device 100 may be configured to perform write operations in order from memory cells close to the substrate SUB (refer to FIGS. 4 and 5) to memory cells distant from the substrate SUB. The reclaim scheduler 220 may be configured to first reclaim data of a zone having a small read count and to then reclaim data of a zone having a great read count.

Figure 14:
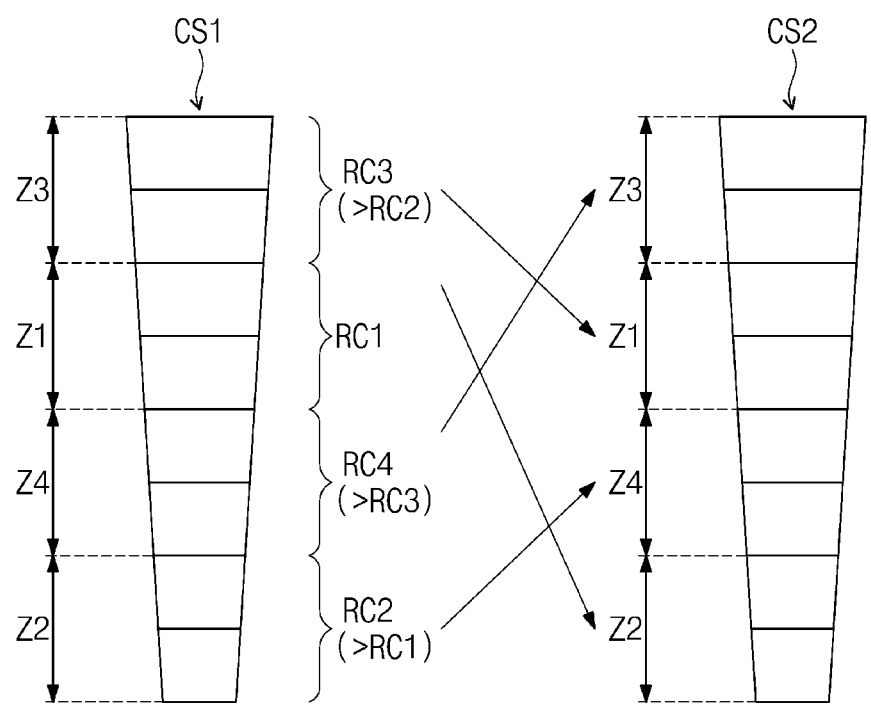
FIG. 14 illustrates an example in which data of a first cell string belonging to a memory block targeted for the read reclaim operation are moved to a second cell string belonging to another memory block.

FIG. 14 illustrates an example in which data of a first cell string CS1 belonging to a memory block targeted for the read reclaim operation are moved (or copied) to a second cell string CS2 belonging to another memory block. In FIG. 14, a first cell string CS1 may be regarded as representing a memory block targeted for the read reclaim operation, and a second cell string CS2 may be regarded as representing another memory block to which data are to be moved (or copied).

Referring to FIGS. 1 and 14, the first zone Z1 of the first cell string CS1 may be estimated as having a first read count RC1. The second zone Z2 of the first cell string CS1 may be estimated as having a second read count RC2 greater than the first read count RC1. The third zone Z3 of the first cell string CS1 may be estimated as having a third read count RC3 greater than the second read count RC2. The fourth zone Z4 of the first cell string CS1 may be estimated as having a fourth read count RC4 greater than the third read count RC3.

In the read reclaim operation, data stored in the fourth zone Z4 of the first cell string CS1 having the fourth read count RC4 being the greatest may be moved (or copied) to the third zone Z3 of the second cell string CS2. Here, because memory cells of the third zone Z3 are the largest, a program speed of the memory cells of the third zone Z3 may be the slowest, and the robustness thereof may be the strongest. Data stored in the third zone Z3 of the first cell string CS1 having the third read count RC3 being the second-greatest may be moved (or copied) to the first zone Z1 of the second cell string CS2, of which the robustness is the second-strongest.

Data stored in the second zone Z2 of the first cell string CS1 having the second read count RC2 being the third-greatest may be moved (or copied) to the fourth zone Z4 of the second cell string CS2, of which the robustness is the third-strongest. Data stored in the first zone Z1 of the first cell string CS1 having the first read count RC1 being the smallest may be moved (or copied) to the second zone Z2 of the second cell string CS2, of which the robustness is the weakest.

Figure 15:
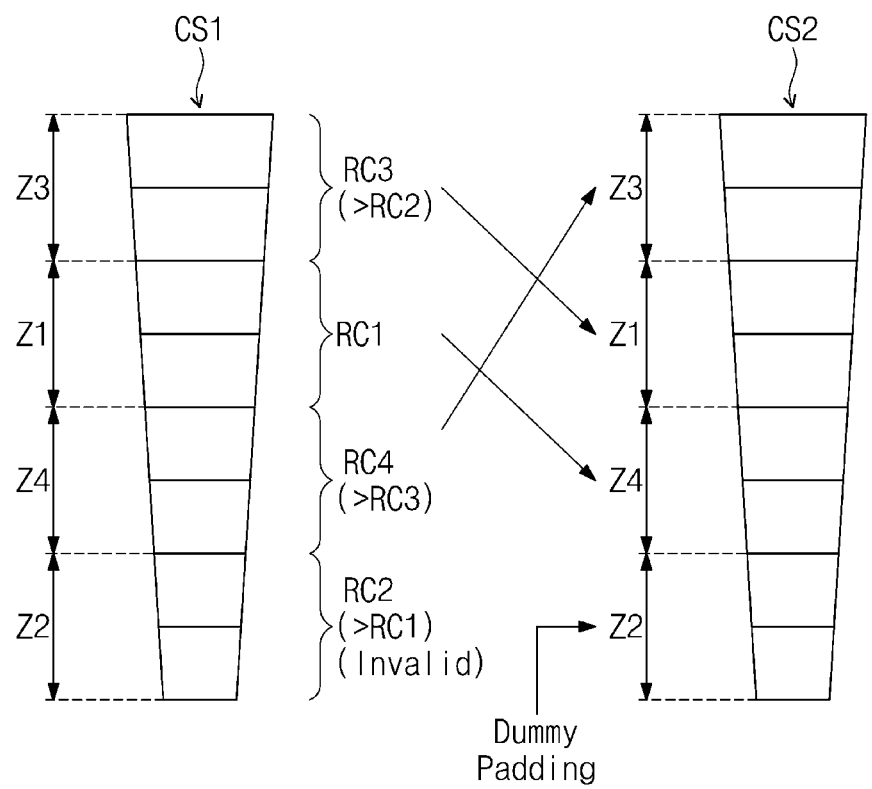
FIG. 15 illustrates another example in which data of a first cell string belonging to a memory block targeted for the read reclaim operation are moved to a second cell string belonging to another memory block.

FIG. 15 illustrates an example in which data of the first cell string CS1 belonging to a memory block targeted for the read reclaim operation are moved (or copied) to the second cell string CS2 belonging to another memory block. Referring to FIGS. 1 and 15, in an embodiment, all data stored in the second zone Z2 may be invalid data. In this case, the data stored in the second zone Z2 may be excluded from a target of the read reclaim operation.

In an embodiment, invalid data may include data that are not accessed any more due to deletion or update on a file system even though the data are stored in memory cells.

As the data stored in the second zone Z2 are excluded from a target of the read reclaim operation, a storage space of the second cell string CS2 may fail to be filled with reclaimed data. As a time when memory cells are maintained in an erase state increases, the reliability of data to be written in the memory cells may decrease. To prevent the reliability of data from decreasing, dummy data may be written instead of data excluded from a target of the read reclaim operation.

The writing of dummy data may be dummy padding. Dummy data may be data that the storage device 100 randomly generates and may not be associated with the external host device. Dummy data may be written for the purpose of preventing different data from being written at memory cells and may be excluded from a target of a read operation. In the example illustrated by FIG. 15, dummy padding is written into zone Z2 of the second cell string CS2.

The description is given with reference to FIG. 15 as data of one zone are invalid data. However, invalid data may be only a portion of data of one zone, not all of the data. Even in this case, invalid data may be excluded from a target of the read reclaim operation. Valid data may be sequentially written in order from memory cells having the strongest robustness to memory cells having the weakest robustness. Memory cells that correspond to a capacity of invalid data and are of the weakest robustness may be padded by dummy data.

Figure 16:
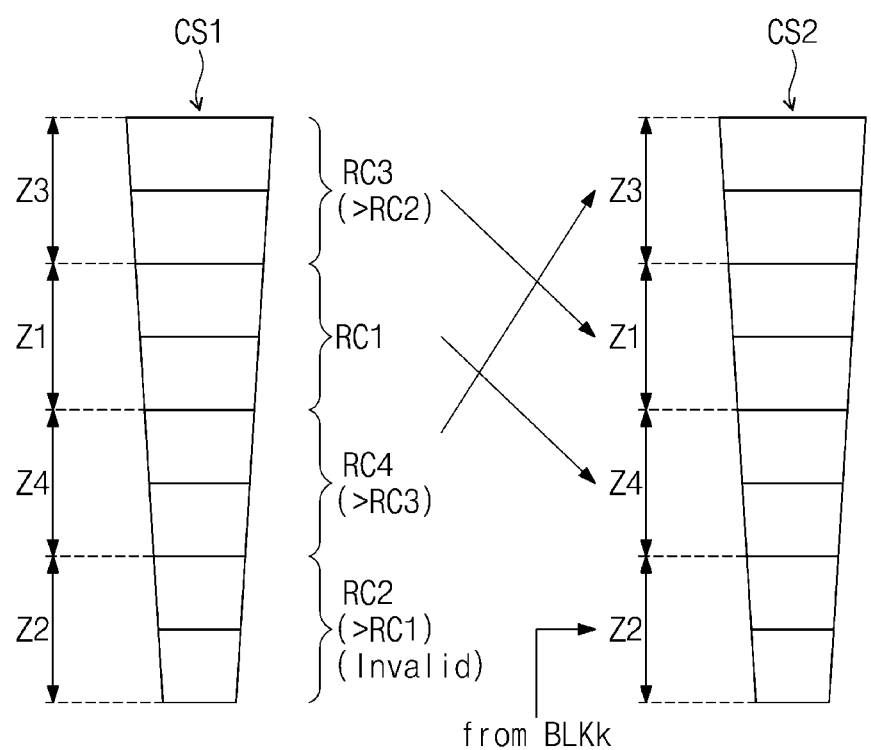
FIG. 16 illustrates another example in which data of a first cell string belonging to a memory block targeted for the read reclaim operation are moved to a second cell string belonging to another memory block.

FIG. 16 illustrates another example in which data of the first cell string CS1 belonging to a memory block targeted for the read reclaim operation are moved (or copied) to the second cell string CS2 belonging to another memory block. Referring to FIGS. 1 and 16, in an embodiment, all data stored in the second zone Z2 may be invalid data. In this case, the data stored in the second zone Z2 may be excluded from a target of the read reclaim operation.

Compared to the embodiment of FIG. 15, a storage capacity of the second cell string CS2 corresponding to the invalid data may not be padded with dummy data, but the storage capacity may be filled with data of another memory block BLKk targeted for the read reclaim operation. For example, data of the memory block BLKk that shares a spatial locality or a temporal locality with data stored at the first cell string CS1 may be moved (or copied) to the second cell string CS2.

Data, which have a read count similar to the first, third, and fourth read counts RC1, RC3, and RC4, from among pieces of data stored in the memory block BLKk may be moved (or copied) to the second cell string CS2. A capacity of the second cell string CS2 may be prevented from being wasted by moving (or copying) data of the memory block BLKk to the second cell string CS2.

Figure 17:
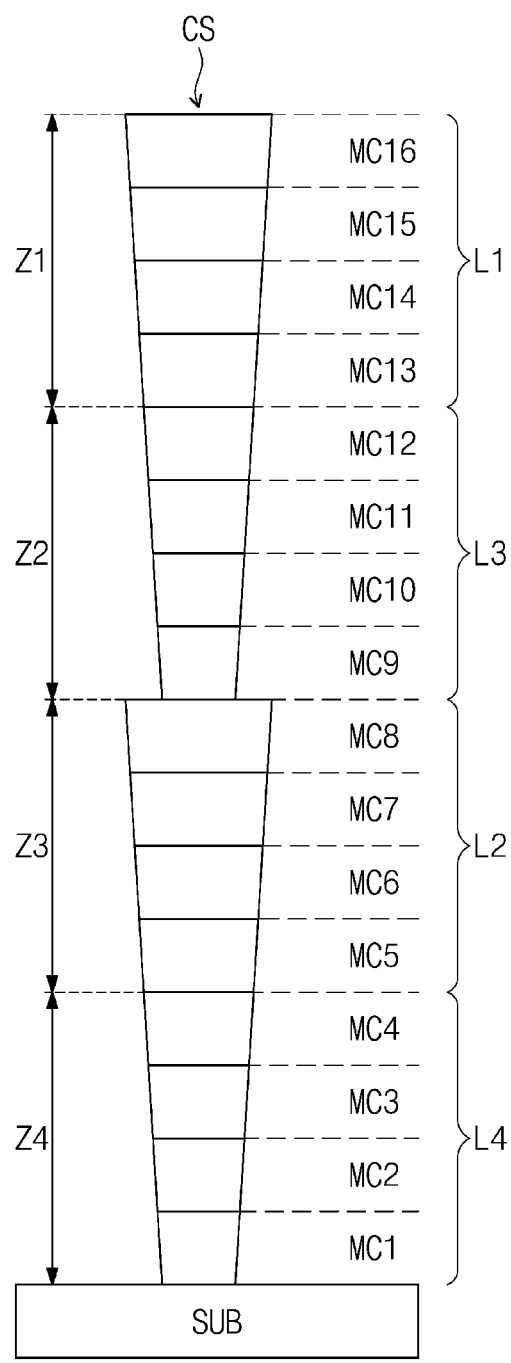
FIG. 17 illustrates an example in which a cell string is implemented in a stacked structure.

FIG. 17 illustrates an example in which the cell string CS is implemented in a stacked structure. Referring to FIGS. 1, 4, and 17, a first layer corresponding to first to eighth memory cells MC1 to MC8 may be placed on the substrate SUB. A second layer corresponding to ninth to sixteenth memory cells MC9 to MC16 may be placed on the first layer. In the first layer, as a distance from the substrate SUB increases, sizes of the memory cells MC1 to MC8 may increase. In the second layer, as a distance from the substrate SUB increases, sizes of the memory cells MC9 to MC16 may increase.

The size of the uppermost memory cell of the first layer, that is, the memory cell MC8 may be larger than the size of the lowermost memory cell of the second layer, that is, the memory cell MC9. In an embodiment, the second layer may have the same (or similar) structure and dimensions as the first layer.

In an embodiment, the first layer may be divided into a third zone Z3 and a fourth zone Z4. The second layer may be divided into a first zone Z1 and a second zone Z2. The robustness of the first zone Z1 placed at an upper portion of the second layer may have a first level L1 being the greatest.

The robustness of the third zone Z3 placed at an upper portion of the first layer may have a second level L2 being the second-greatest.

The robustness of the second zone Z2 placed at a lower portion of the second layer may have a third level L3 being the third-greatest. The robustness of the fourth zone Z4 placed at a lower portion of the first layer may have a fourth level L4 being the smallest.

The storage device 100 may perform write operations in order from the first zone Z1 to the fourth zone Z4. In the read reclaim operation, data of a zone, of which a read count is the greatest, may be written at the first zone Z1 of the cell string CS, of which the robustness is the strongest. Data of a zone, of which a read count is the third-greatest, may be written at the second zone Z2 of the cell string CS, of which the robustness is the third-strongest.

Data of a zone, of which a read count is the second-greatest, may be written at the third zone Z3, of which the robustness is the second-strongest. Data of a zone, of which a read count is the smallest, may be written at the fourth zone Z4, of which the robustness is the weakest.

As described above, a storage device according to an embodiment of the disclosure may perform the read reclaim operation in consideration of a characteristic (e.g., hot or cold) of data targeted for the read reclaim operation and the robustness of a storage area to which data are to be moved (or copied). Accordingly, the reliability of reclaimed data is improved.

In the above embodiments, components according to the disclosure are described by using the terms "first", "second", "third", and the like. However, the terms "first", "second", "third", and the like may be used to distinguish components from each other and do not limit the disclosure. For example, the terms "first", "second", "third", and the like do not involve an order or a numerical meaning of any form.

According to the disclosure, data of a high frequency of a read operation are written in a storage space in which the robustness against the degradation is stronger, in a read reclaim operation. Accordingly, a storage device capable of improving the reliability of data in the read reclaim operation and an operating method of the storage device are provided.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the disclosure has been described with reference to exemplary embodiments thereof, it will be apparent to those of ordinary skill in the art that various changes and modifications may be made thereto without departing from the spirit and scope of the disclosure as set forth in the following claims.

What is claimed is:

1. A storage device comprising:
a nonvolatile memory device including a first storage area and a second storage area; and
a controller configured to control the nonvolatile memory device and to perform a read reclaim operation of reading data stored in the first storage area of the nonvolatile memory device and writing the read data in the second storage area, wherein:
the controller divides each of the first storage area and the second storage area into two or more zones,
before the read reclaim operation, the controller is further configured to control the nonvolatile memory device to perform sample read operations on the first storage area and to determine respective zones of the second storage area among the two or more zones, at which data of the respective zones of the first storage area are to be written, based on results of the sample read operations,
the controller controls the nonvolatile memory device to perform the sample read operations on the two or more zones of the first storage area, respectively, and
the controller is further configured to estimate read counts of the two or more zones of the first storage area from the results of the sample read operations.

2. The storage device of claim 1, wherein the controller estimates the read counts of the two or more zones of the first storage area from the results of the sample read operations, based on machine learning.

3. The storage device of claim 1, wherein:
the nonvolatile memory device includes memory blocks, each of which includes cell strings,
each of the cell strings includes memory cells stacked on a substrate in a direction perpendicular to the substrate,
the first storage area is a first memory block among the memory blocks, and
the second storage area is a second memory block among the memory blocks.

4. The storage device of claim 3, wherein:
the cell strings of each of the memory blocks are connected with word lines, and
the controller is further configured to estimate the read counts of the two or more zones of the first memory block from information of a word line where the sample read operations are performed, information of the first memory block, and a program/erase count of the first memory block, based on machine learning.

5. The storage device of claim 4, wherein sizes of the memory cells of each of the cell strings increase as a distance from the substrate increases.

6. The storage device of claim 4, wherein the controller controls the nonvolatile memory device to write data of a first zone having a greatest read count from among the two or more zones of the first memory block into memory cells belonging to a zone being most distant from the substrate from among the memory cells of each of the cell strings of the second memory block.

7. The storage device of claim 4, wherein each of the read counts indicates a number of times a read operation is performed at a corresponding one of the two or more zones of the first memory block after the data are written in the first memory block.

8. The storage device of claim 1, wherein in the read reclaim operation, the controller further determines respective zones of the second storage area, at which the data of the respective zones of the first storage area are to be rewritten, based on the robustness to maintain programmed threshold voltages of the two or more zones of the second storage area.

9. The storage device of claim 1, wherein in the read reclaim operation, data read from the two or more zones of the first storage area having higher estimated read counts are rewritten in a zone of the two or more zones of the second storage area having higher robustness to maintain programmed threshold voltages than data read from the two or more zones of the first storage area having lower estimated read counts.

10. An operating method of a storage device which includes a first storage area and a second storage area each including two or more zones, the method comprising:
performing two or more sample read operations on the first storage area to estimate read counts of the two or more zones of the first storage area; and
performing a read reclaim operation of writing data of the first storage area into the second storage area, wherein
before the read reclaim operation, respective zones of the second storage area, at which data of the respective zones of the first storage area are written, are adjusted based on the read counts.

11. The method of claim 10, wherein data of a zone having a greater read count from among the two or more zones of the first storage area are written in memory cells, of which a program speed is slow, from among memory cells of the second storage area.

12. The method of claim 10, wherein each of the sample read operations includes:
selecting sample memory cells from memory cells of a corresponding zone of the two or more zones of the first storage area, and
counting a number of on-cells each having a threshold voltage lower than a first voltage from among the sample memory cells and a number of off-cells each having a threshold voltage higher than a second voltage from among the sample memory cells.

13. The method of claim 12, wherein:
the first voltage belongs to a voltage range of an erase state corresponding to a lowest threshold voltage from among states of the sample memory cells, and
the second voltage belongs to a voltage range of a program state corresponding to a highest threshold voltage from among the states of the sample memory cells.

14. The method of claim 12, wherein memory cells having a highest program speed, from among the memory cells of the corresponding zone, are selected as the sample memory cells.

15. The method of claim 10, wherein while an idle state is maintained, a number of the two or more zones of the first storage area increases, a number of the sample read operations increases, and a number of the read counts corresponding to the number of the two or more zones respectively increases.

16. The method of claim 10, wherein dummy data are written at a zone of the second storage area, which corresponds to a zone of invalid data of the data of the first storage area.

17. The method of claim 10, wherein data from a third storage area of the storage device are written at a zone of the second storage area, which corresponds to a zone of invalid data of the data of the first storage area.

18. A storage device comprising:
a nonvolatile memory device including memory blocks, each of which includes cell strings, wherein each of the cell strings includes memory cells stacked on a substrate in a direction perpendicular to the substrate; and
a controller, wherein
before a read reclaim operation in which data of a first memory block among the memory blocks are read and then written in a second memory block, the controller performs sample read operations at the first memory block to estimate read counts of the data of the first memory block and determines locations of the second memory block, at which the data are to be written, depending on the read counts, the locations having different distances from the substrate.

19. The storage device of claim 18, wherein:
the memory cells of each of the cell strings have different sizes depending on a distance from the substrate, and
the controller writes data corresponding to a greater read count from among the data in memory cells having greater sizes at the cell strings of the second memory block.

20. The storage device of claim 18, wherein the controller is further configured to estimate the read counts by using a number of on-cells turned on in response to a first voltage during the sample read operations, a number of off-cells turned off in response to a second voltage during the sample read operations, information of the first memory block, information of word lines where the sample read operations are performed, and a program/erase count of the first memory block, based on machine learning.

* * * * *